(12) United States Patent
Fukunaga et al.

(10) Patent No.: US 12,160,201 B2
(45) Date of Patent: Dec. 3, 2024

(54) DOHERTY AMPLIFIER

(71) Applicant: Mitsubishi Electric Corporation, Tokyo (JP)

(72) Inventors: Kei Fukunaga, Tokyo (JP); Yuji Komatsuzaki, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 412 days.

(21) Appl. No.: 17/522,082

(22) Filed: Nov. 9, 2021

(65) Prior Publication Data
US 2022/0069776 A1 Mar. 3, 2022

Related U.S. Application Data

(63) Continuation of application No. PCT/JP2019/022751, filed on Jun. 7, 2019.

(51) Int. Cl.
*H03F 1/02* (2006.01)
*H03F 1/56* (2006.01)
*H03F 3/21* (2006.01)

(52) U.S. Cl.
CPC ........... *H03F 1/0288* (2013.01); *H03F 3/211* (2013.01)

(58) Field of Classification Search
CPC .......... H03F 1/0288; H03F 3/211; H03F 1/56; H03F 3/60; H03F 2200/451
USPC ................................ 330/295, 124 R, 84, 286
See application file for complete search history.

(56) References Cited

U.S. PATENT DOCUMENTS

| 7,646,248 B2 * | 1/2010 | Yang ........................ H03F 1/56 |
| | | 330/124 R |
| 10,673,386 B2 * | 6/2020 | McLaren ................ H03F 3/601 |
| 2009/0206926 A1 | 8/2009 | Horiguchi et al. |
| 2019/0149097 A1 | 5/2019 | Komatsuzaki et al. |
| 2019/0173435 A1 | 6/2019 | Mclaren et al. |

FOREIGN PATENT DOCUMENTS

| CN | 107425814 A | 12/2017 |
| EP | 1 912 328 B1 | 9/2011 |

(Continued)

OTHER PUBLICATIONS

German Office Action for German Application No. 11 2019 007 283.8, dated Mar. 13, 2024, with English translation.

(Continued)

*Primary Examiner* — Hieu P Nguyen
(74) *Attorney, Agent, or Firm* — Birch, Stewart, Kolasch & Birch, LLP

(57) ABSTRACT

A Doherty amplifier includes: amplifiers including a main amplifier and an auxiliary amplifier; output circuits for increase in back-off amount including a first output circuit disposed between the main amplifier and an output combination unit provided by the amplifiers, and having a first electric length, and a second output circuit disposed between the auxiliary amplifier and the output combination unit, and having a second electric length; and a frequency characteristic compensation circuit for band broadening disposed electrically in parallel to the first output circuit, for compensating for the frequency characteristics of the impedances in the output circuits.

19 Claims, 12 Drawing Sheets

(56) References Cited

FOREIGN PATENT DOCUMENTS

| WO | WO 2007/015462 A1 | 2/2007 |
| WO | WO 2017/199366 A1 | 11/2017 |

OTHER PUBLICATIONS

Chinese Office Action and Search Report for Chinese Application No. 201980097069.1, dated May 9, 2024, with English translation of the Office Action.
Chinese Office Action for Chinese Application No. 201980097069.1, dated Sep. 9, 2024, with English translation.

\* cited by examiner

DOHERTY AMPLIFIER

CROSS REFERENCE TO RELATED APPLICATIONS

This application is a Continuation of PCT International Application No. PCT/JP2019/022751, filed on Jun. 7, 2019, which is hereby expressly incorporated by reference into the present application.

TECHNICAL FIELD

The present invention relates to a Doherty amplifier.

BACKGROUND ART

In recent years, the peak to average power ratio (PAPR) in modulated signals for communication has been increasing because of communication volume. From the viewpoint to deal with the increase in the PAPR, an improvement in the efficiency in an operating state with output power lower than saturated output power (referred to as a "back-off operating state" hereinafter) is required of amplifiers for communication devices.

In normal amplifiers, the efficiency in the back-off operating state is lower than the efficiency in an operating state with the saturated output power (referred to as a "saturated operating state" hereinafter). More concretely, the efficiency decreases gradually with decrease in the output power. In contrast with this, by using a Doherty amplifier, an improvement in the efficiency in the back-off operating state can be provided.

More specifically, a Doherty amplifier has a main amplifier, i.e., a so-called "carrier amplifier." Further, a Doherty amplifier has an auxiliary amplifier, i.e., a so-called "peak amplifier." When the output power required of a Doherty amplifier (referred to as the "required output power" hereinafter) is equal to or greater than a predetermined value, while the carrier amplifier is set to an on state, the peak amplifier is set to an on state. In contrast, when the required output power is less than the predetermined value, while the carrier amplifier is set to the on state, the peak amplifier is set to an off state.

As a result, in the back-off operating state with the output power corresponding to this predetermined value, efficiency equal to the efficiency in the saturated operating state is implemented. More concretely, in the back-off operating state with the output power which is lower than the saturated output power on the order of 6 decibel (described as "dB" hereinafter), efficiency equal to the efficiency in the saturated operating state is implemented. As a result, the PAPR on the order of 6 dB can be dealt with.

Hereinafter, the difference value between the saturated output power and the output power at which efficiency equal to the efficiency in the saturated operating state is implemented in the back-off operating state is referred to as the "back-off amount." More specifically, a Doherty amplifier can deal with the PAPR corresponding to the back-off amount. In Patent Literature 1, a technology of increasing the back-off amount of a Doherty amplifier to larger than 6 dB is disclosed.

More specifically, a phase line (21) is disposed between a carrier amplifier (3) and an output combination point (13) (refer to FIG. 1 and so on of Patent Literature 1). Further, a phase line (23) is disposed between a peak amplifier (7) and the output combination point (13) (refer to FIG. 1 and so on of Patent Literature 1). Here, the electric length ($\theta_1$) of the phase line (21) is set to a value based on a predetermined mathematical expression (refer to the expression (1) of Patent Literature 1). Further, the electric length ($\theta_2$) of the phase line (23) is set to a value based on another predetermined mathematical expression (refer to the expression (2) of Patent Literature 1). As a result, a back-off amount larger than 6 dB is implemented (refer to FIG. 4 and so on of Patent Literature 1).

CITATION LIST

Patent Literature

Patent Literature 1: WO No. 2007/015462

SUMMARY OF INVENTION

Technical Problem

As will be mentioned later by reference to FIGS. 1 to 7, in conventional Doherty amplifiers, particularly when the auxiliary amplifier is set to the off state, the impedance on the output side with respect to the main amplifier greatly varies depending on frequency. A problem is that such a variation in the impedance narrows a frequency band within which it can operate (referred to as an "operating frequency band" hereinafter).

The present invention is made in order to solve the above-mentioned problem, and it is therefore an object of the present invention to achieve both the increase in back-off amount and broadening in the operating frequency band (referred to as "band broadening" hereinafter) in Doherty amplifiers.

Solution to Problem

A Doherty amplifier of the present invention includes: amplifiers including a main amplifier and an auxiliary amplifier; output circuits for increase in back-off amount including a first output circuit disposed between the main amplifier and an output combiner provided by the amplifiers, and having a first electric length, and a second output circuit disposed between the auxiliary amplifier and the output combiner, and having a second electric length; and a frequency characteristic compensation circuit for band broadening disposed electrically in parallel to the first output circuit, to compensate for the frequency characteristics of the impedances in the output circuits.

Advantageous Effects of Invention

According to the present invention, because it is constituted as above, both the increase in the back-off amount and the band broadening can be achieved.

DESCRIPTION OF EMBODIMENTS

Hereinafter, in order to explain the present invention in greater detail, embodiments of the present invention will be described with reference to the accompanying drawings.

Embodiment 1

Figure 1:
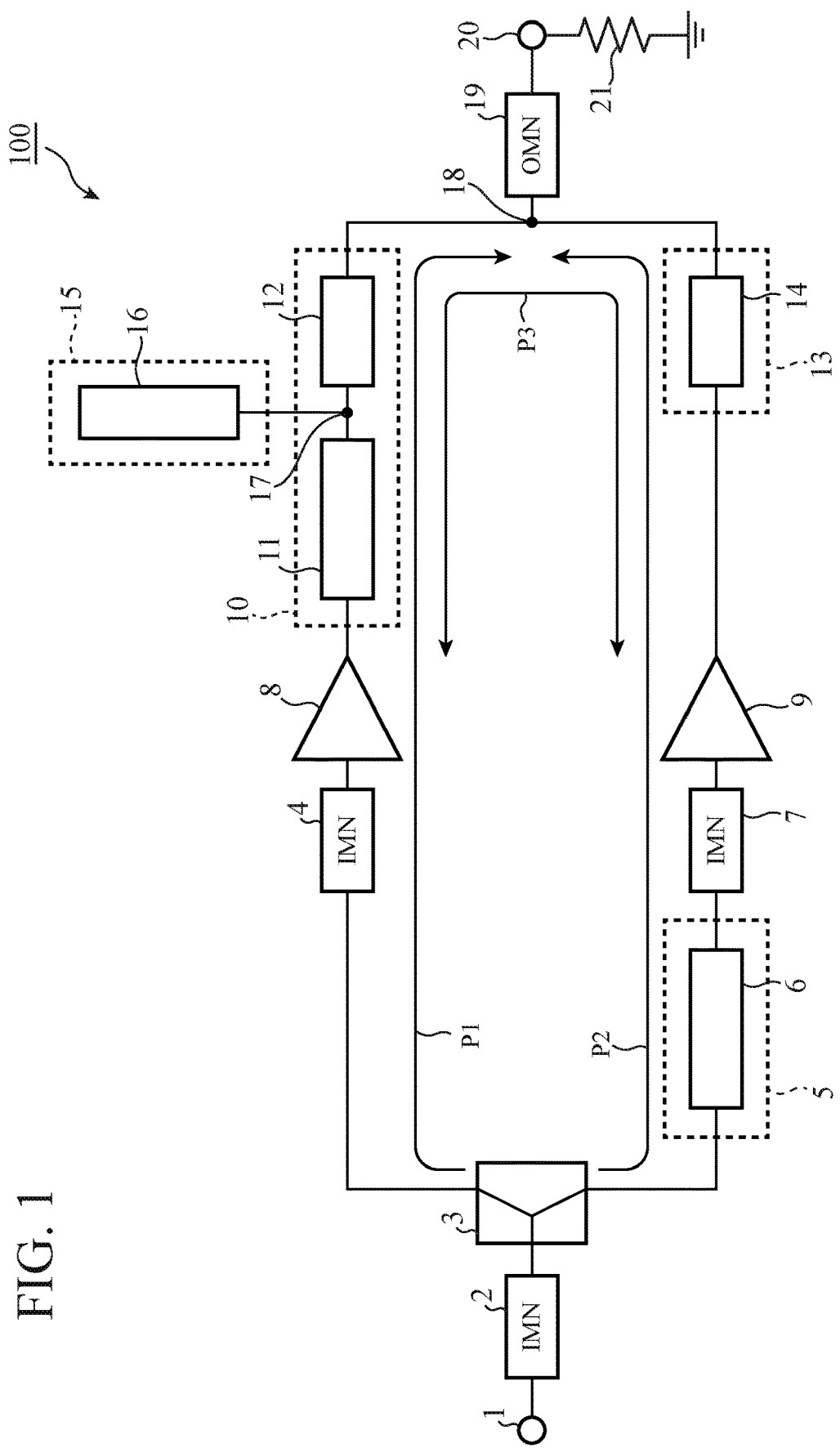
FIG. 1 is a circuit diagram showing a main part of a Doherty amplifier according to Embodiment 1.

FIG. 1 is a circuit diagram showing a main part of a Doherty amplifier according to Embodiment 1. The Doherty amplifier according to Embodiment 1 will be explained by reference to FIG. 1.

Hereinafter, unless otherwise specified, it is assumed that an electric length's value is one at a predetermined frequency (referred to as a "reference frequency" hereinafter) f_ref. The reference frequency f_ref is set to, for example, a value equal to a center frequency f_center in a usable frequency band (referred to as an "operating frequency band" hereinafter).

In the figure, 1 denotes an input terminal. The input terminal 1 is electrically connected to a signal source (not illustrated). The input terminal 1 receives input of a signal to the Doherty amplifier 100. An input matching circuit 2 ("IMN" in the figure) is disposed between the input terminal 1 and a splitter 3. The input matching circuit 2 provides an impedance match between the input terminal 1 and the splitter 3. The input matching circuit 2 is constituted by, for example, a lumped constant circuit, a distributed constant circuit, a composite circuit constituted by a lumped constant and a distributed constant, an LC matching circuit, or a circuit using one or more λ/4 lines.

The splitter 3 splits an output signal provided by the input matching circuit 2 into signals for two routes P1 and P2. The splitter 3 outputs the signals generated by signal splitting. One route (may be referred to as a "first route" hereinafter) P1 of the two routes P1 and P2 includes a main amplifier 8. The other route (may be referred to as a "second route" hereinafter) P2 of the two routes P1 and P2 includes an auxiliary amplifier 9.

The splitter 3 is constituted by, for example, a Wilkinson splitter or a hybrid circuit. Each circuit in the hybrid circuit is constituted by, for example, a lumped constant circuit, a distributed constant circuit, a composite circuit constituted by a lumped constant and a distributed constant, an LC matching circuit, or a circuit using one or more λ/4 lines.

An input matching circuit (referred to as a "first input matching circuit" hereinafter) 4 is disposed between the splitter 3 and the main amplifier 8. The first input matching circuit 4 provides an input match for the main amplifier 8. The first input matching circuit 4 is constituted by, for example, a lumped constant circuit, a distributed constant circuit, a composite circuit constituted by a lumped constant and a distributed constant, an LC matching circuit, or a circuit using one or more λ/4 lines.

A phase compensation circuit 5 is disposed between the splitter 3 and the auxiliary amplifier 9. The phase compensation circuit 5 causes the electric length of the second route P2 to be equal to the electric length of the first route P1. The phase compensation circuit 5 is constituted by, for example, a transmission line 6. The transmission line 6 has an electric length equal to the difference in the electric length between the routes P1 and P2.

An input matching circuit (referred to as a "second input matching circuit" hereinafter) 7 is disposed between the splitter 3 and the auxiliary amplifier 9. More concretely, the second input matching circuit 7 is disposed between the phase compensation circuit 5 and the auxiliary amplifier 9. The second input matching circuit 7 provides an input match for the auxiliary amplifier 9. The second input matching circuit 7 is constituted by, for example, a lumped constant circuit, a distributed constant circuit, a composite circuit constituted by a lumped constant and a distributed constant, an LC matching circuit, or a circuit using one or more λ/4 lines.

The main amplifier 8 amplifies an output signal provided by the first input matching circuit 4. The main amplifier 8 outputs this amplified signal. The main amplifier 8 is constituted by a transistor. Concretely, for example, the main amplifier 8 is constituted by a field effect transistor (FET), a heterojunction bipolar transistor (HBT), or a high electron mobility transistor (HEMT). The gate bias of the main amplifier 8 is set to a value corresponding to so-called "A class", a value corresponding to so-called "B class", or a value between the A class value and the B class value.

The auxiliary amplifier 9 amplifies an output signal provided by the second input matching circuit 7. The auxiliary amplifier 9 outputs this amplified signal. The auxiliary amplifier 9 is constituted by a transistor. Concretely, for example, the auxiliary amplifier 9 is constituted by an FET, an HBT, or a HEMT. The gate bias of the auxiliary amplifier 9 is set to a value corresponding to so-called "C class."

Hereinafter, the main amplifier 8 and the auxiliary amplifier 9 may be collectively and simply referred to as the "amplifiers." The amplifiers 8 and 9 have electrical properties of output that are equivalent to each other (e.g., output resistance and output amplitude) with respect to bias amounts. Therefore, in case that the bias amounts of the amplifiers 8 and 9 are set to an equal value, the electrical properties of an output provided by the main amplifier 8 become equivalent to the electrical properties of an output provided by the auxiliary amplifier 9. Further, in this case, the saturated output power of the main amplifier 8 becomes equal to the saturated output power of the auxiliary amplifier 9.

In the figure, 18 denotes a portion where the outputs provided by the amplifiers 8 and 9 are combined (referred to as an "output combination unit" hereinafter). A first output circuit 10 is disposed between the main amplifier 8 and the output combination unit 18. The first output circuit 10 is constituted by, for example, two transmission lines 11 and 12. One transmission line (referred to as a "first transmission line" hereinafter) 11 of the two transmission lines 11 and 12 has an electric length of 90 degrees or approximately 90 degrees. The other transmission line (referred to as a "second transmission line" hereinafter) 12 of the two transmission lines 11 and 12 has an electric length of less than 90 degrees.

Further, a second output circuit 13 is disposed between the auxiliary amplifier 9 and the output combination unit 18. The second output circuit 13 is constituted by, for example, a transmission line (referred to as a "third transmission line" hereinafter) 14. The third transmission line 14 has an electric length of less than 90 degrees. Hereinafter, the first output circuit 10 and the second output circuit 13 may be collectively and simply referred to as the "output circuits."

Here, the electric length θ1 of the first output circuit 10 (referred to as the "first electric length" hereinafter), i.e., the sum total of the electric lengths of the first transmission line 11 and the second transmission line 12 is set to a value based on the following expression (1). Further, the characteristic impedance of the first output circuit 10 is set to a value equal to the optimum load impedance Ropt1 in the saturated operating state of the main amplifier 8.

$$\theta 1 = \tan^{-1}\left(-\sqrt{\frac{\gamma(\gamma-1)}{\gamma-4}}\right) \quad (1)$$

Further, the electric length θ2 of the second output circuit 13 (referred to as the "second electric length" hereinafter), i.e., the electric length of the third transmission line 14 is set to a value based on the following expression (2). Further, the characteristic impedance of the second output circuit 13 is set to a value equal to the optimum load impedance Ropt2 in the saturated operating state of the auxiliary amplifier 9. Here, Ropt2 is set to a value equal to Ropt1. For example, Ropt1=Ropt and Ropt2=Ropt.

$$\theta 2 = \tan^{-1}\left(-\sqrt{\frac{\gamma(\gamma-4)(\gamma-1)}{\gamma}}\right) \quad (2)$$

γ in the above-mentioned expressions (1) and (2) has a value corresponding to the back-off amount OBO which is requested of the Doherty amplifier 100 (referred to as the "requested back-off amount" hereinafter). More concretely, γ has a value based on the following expression (3).

$$OBO \text{ [dB]}=10 \log_{10}(\gamma) \quad (3)$$

More specifically, the sum total of the electric lengths of the second transmission line 12 and the third transmission line 14 is set to 90 degrees or approximately 90 degrees. Therefore, the sum total of the electric lengths of the first transmission line 11, the second transmission line 12, and the third transmission line 14 is set to 180 degrees or approximately 180 degrees. In other words, the sum total of the electric lengths of the first output circuit 10 and the second output circuit 13 is set to 180 degrees or approximately 180 degrees.

The parasitic element of the main amplifier 8 is cancelled out by an inductor (not illustrated). As an alternative, the parasitic element of the main amplifier 8 is taken into the first output circuit 10 on the circuit. Therefore, the first output circuit 10 is linked directly with an output part of the main amplifier 8 from the viewpoint of electric lengths. Further, the parasitic element of the auxiliary amplifier 9 is cancelled out by another inductor (not illustrated). As an alternative, the parasitic element of the auxiliary amplifier 9 is taken into the second output circuit 13 on the circuit.

Therefore, the second output circuit 13 is linked directly with an output part of the auxiliary amplifier 9 from the viewpoint of electric lengths.

Hereinafter, a characteristic showing impedance with respect to frequencies is referred to as a "frequency characteristic." The Doherty amplifier 100 has a frequency characteristic compensation circuit 15. The frequency characteristic compensation circuit 15 compensates for the frequency characteristics in the output circuits 10 and 13 particularly when the auxiliary amplifier 9 is set to an off state. The compensation for the frequency characteristics by the frequency characteristic compensation circuit 15 will be mentioned later by reference to FIGS. 1 to 7.

The frequency characteristic compensation circuit 15 is disposed electrically in parallel to the first output circuit 10. The frequency characteristic compensation circuit 15 is constituted by, for example, an open stub 16 having an electric length of 180 degrees or approximately 180 degrees. In the figure, 17 denotes a portion where the first transmission line 11, the second transmission line 12, and the open stub 16 are connected (referred to as a "connecting portion" hereinafter).

In a portion P3 on output sides of the amplifiers 8 and 9 (referred to as a "partial route" hereinafter), out of the routes P1 and P2, so-called "isolation" is not implemented. As shown in FIG. 1, the partial route P3 includes the first output circuit 10, the second output circuit 13, and the output combination unit 18, out of the routes P1 and P2.

An output matching circuit 19 ("OMN" in the figure) is disposed between the output combination unit 18 and an output terminal 20. The output matching circuit 19 provides an impedance match between the output combination unit 18 and the output terminal 20. The output matching circuit 19 is constituted by, for example, a lumped constant circuit, a distributed constant circuit, a composite circuit constituted by a lumped constant and a distributed constant, an LC matching circuit, or a circuit using one or more λ/4 lines. The output terminal 20 is electrically connected to a load 21.

The main part of the Doherty amplifier 100 is constituted by the input terminal 1, the input matching circuit 2, the splitter 3, the first input matching circuit 4, the phase compensation circuit 5, the second input matching circuit 7, the main amplifier 8, the auxiliary amplifier 9, the first output circuit 10, the second output circuit 13, the frequency characteristic compensation circuit 15, the output matching circuit 19, and the output terminal 20.

Next, the operation of the Doherty amplifier 100 will be explained by reference to FIGS. 1 to 7, focusing on impedance conversion when the auxiliary amplifier 9 is set to the off state. In addition, the effect of the Doherty amplifier 100 will be explained. It is assumed that Ropt1=Ropt and Ropt2=Ropt.

Figure 2:
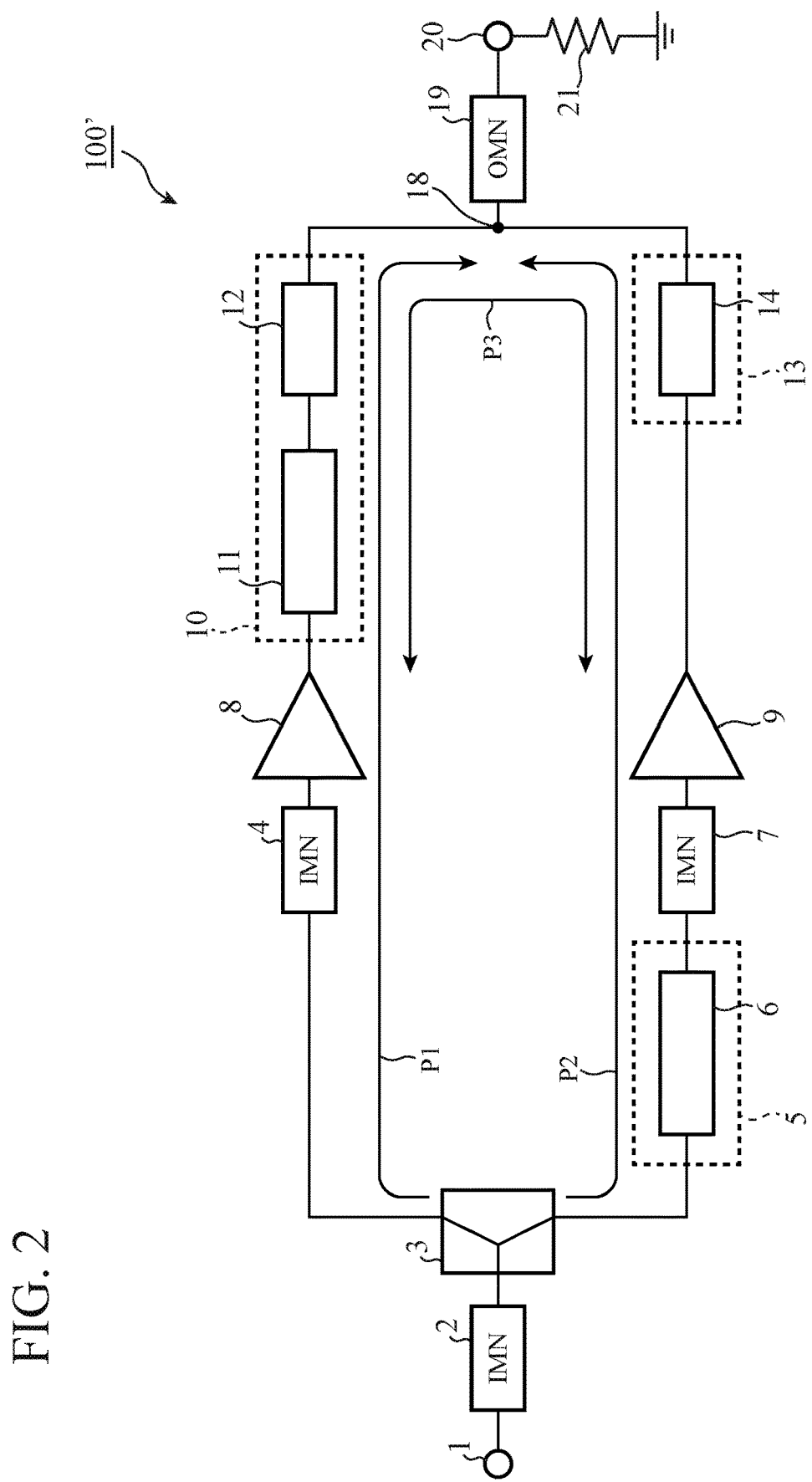
FIG. 2 is a circuit diagram showing a main part of a Doherty amplifier for comparison.

FIG. 2 shows a Doherty amplifier 100' for comparison with the Doherty amplifier 100. As shown in FIG. 2, the Doherty amplifier 100' does not have the frequency characteristic compensation circuit 15. More specifically, the Doherty amplifier 100' corresponds to the conventional Doherty amplifier described in Patent Literature 1 and so on.

Figure 3:
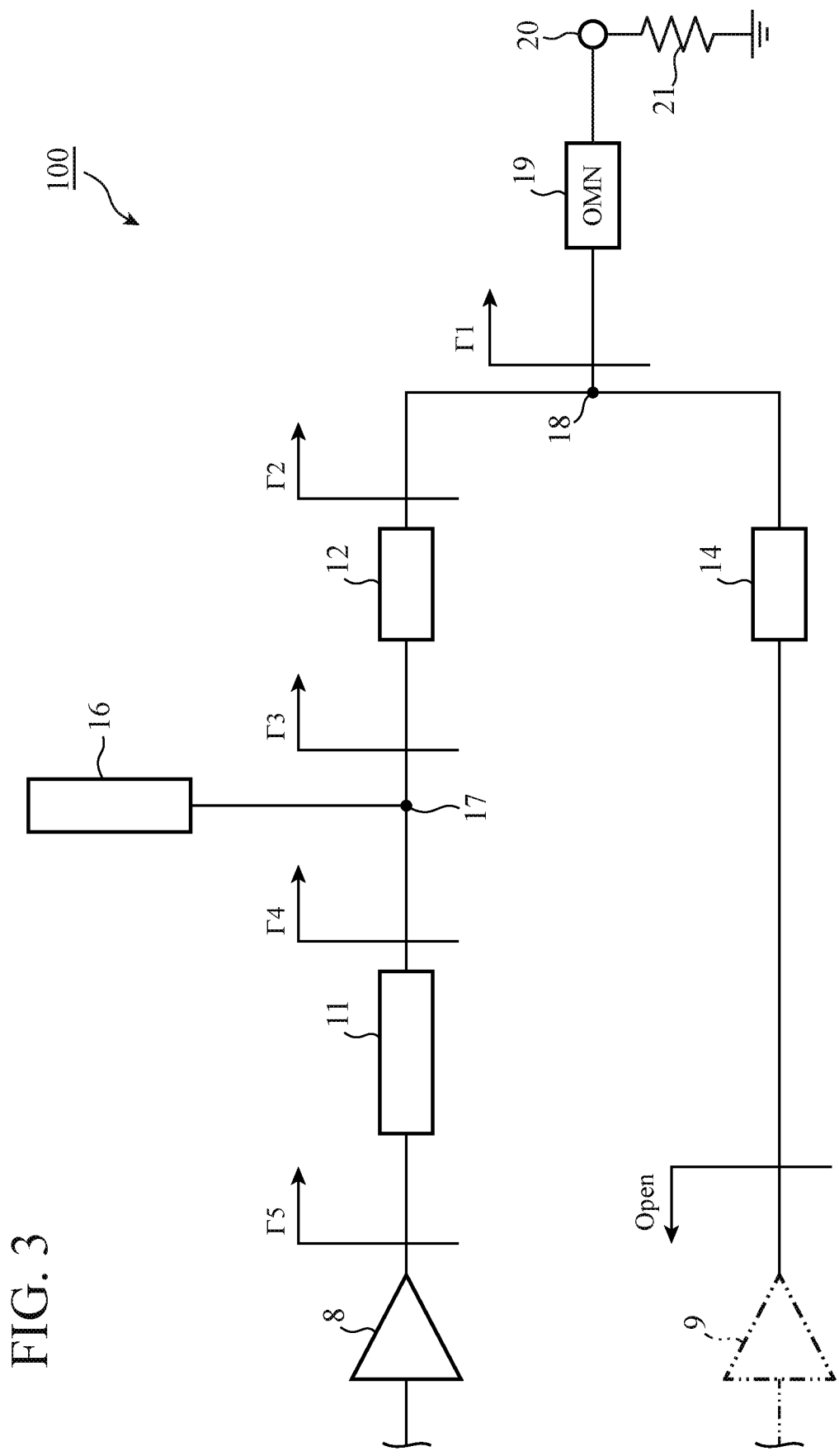
FIG. 3 is an explanatory drawing showing an impedance when an auxiliary amplifier in the Doherty amplifier according to Embodiment 1 is set to an off state.

FIG. 3 shows the impedance in the Doherty amplifier 100 with the auxiliary amplifier 9 set to the off state. In the figure, Γ1 shows the impedance on the output terminal 20 side as viewed from the output combination unit 18. Further, Γ2 shows the impedance on the output terminal 20 side as viewed from an output part of the second transmission line 12. Further, Γ3 shows the impedance on the output terminal 20 side as viewed from the connecting portion 17. Further, Γ4 shows the impedance on the output terminal 20 side as viewed from an output part of the first transmission line 11. Further, Γ5 shows the impedance on the output terminal 20 side as viewed from the output part of the main amplifier 8.

Figure 4:
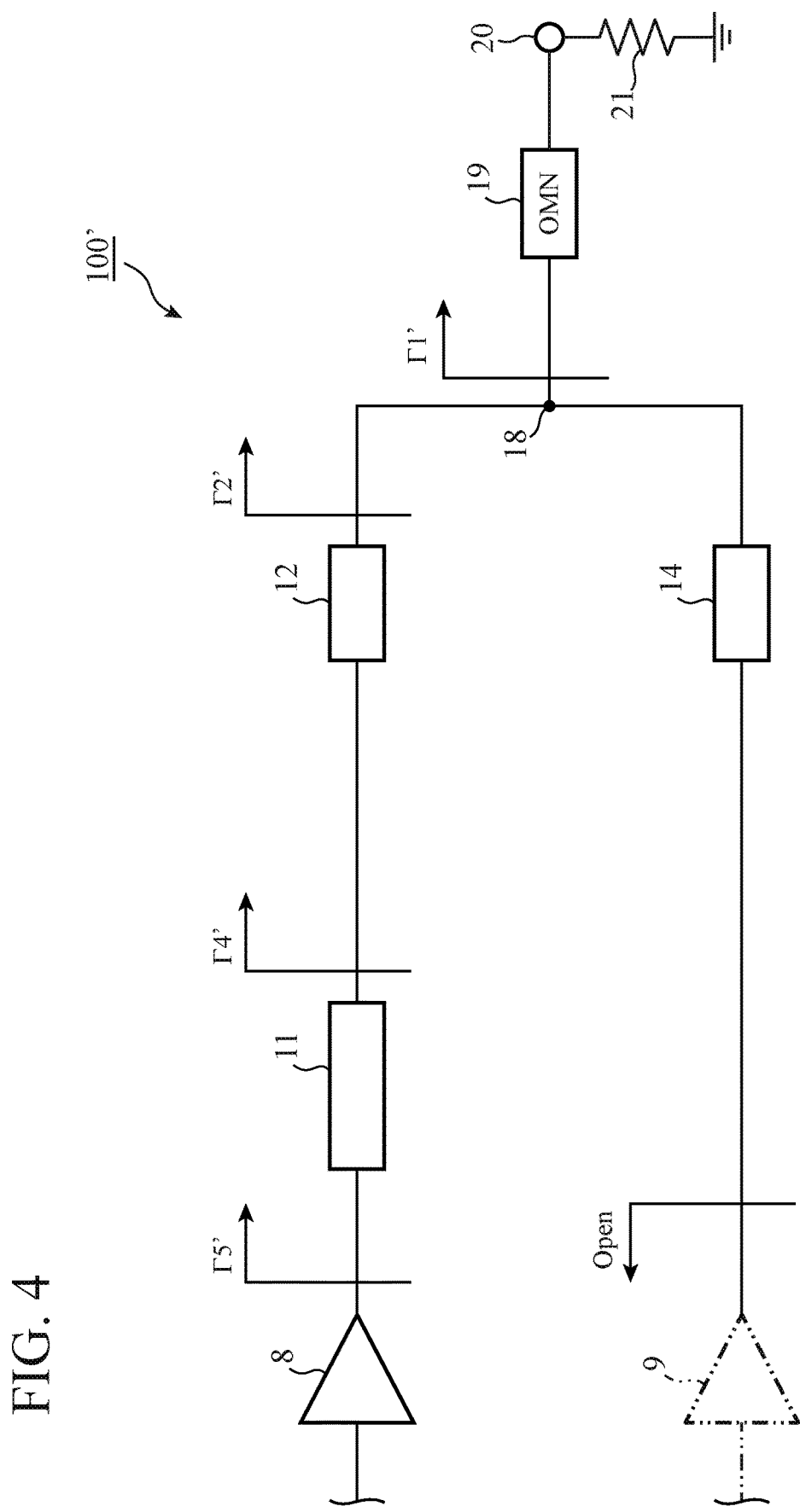
FIG. 4 is an explanatory drawing showing an impedance when an auxiliary amplifier in the Doherty amplifier for comparison is set to an off state.

FIG. 4 shows the impedance in the Doherty amplifier 100' with the auxiliary amplifier 9 set to the off state. In the figure, Γ1' shows the impedance on the output terminal 20 side as viewed from the output combination unit 18. Further, Γ2' shows the impedance on the output terminal 20 side as viewed from the output part of the second transmission line 12. Further, Γ4' shows the impedance on the output terminal 20 side as viewed from the output part of the first transmission line 11. Further, Γ5' shows the impedance on the output terminal 20 side as viewed from the output part of the main amplifier 8.

Figure 5:
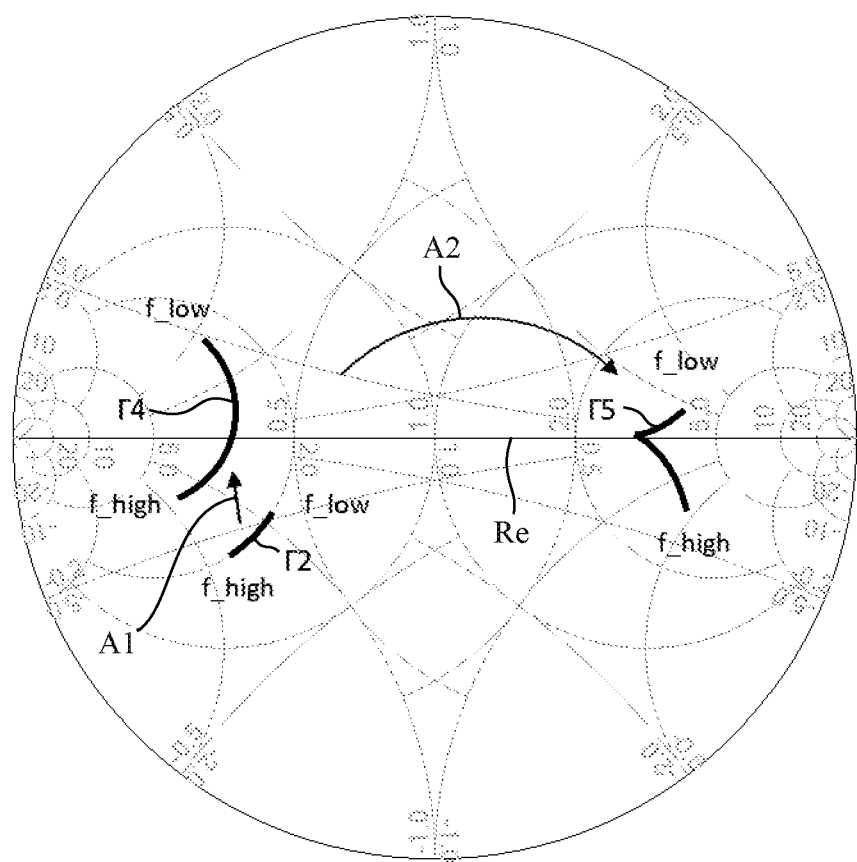
FIG. 5 is an explanatory drawing showing impedance conversion when the auxiliary amplifier in the Doherty amplifier according to Embodiment 1 is set to the off state.

FIG. 5 is a Smith chart in which Γ2, 4, and Γ5 are plotted. In the figure, an arrow A1 shows the impedance conversion from Γ2 to Γ4. Further, an arrow A2 shows the impedance conversion from Γ4 to Γ5. As shown in FIG. 5, each of the following impedances: Γ2, Γ4, and Γ5 varies depending on frequency.

Figure 6:
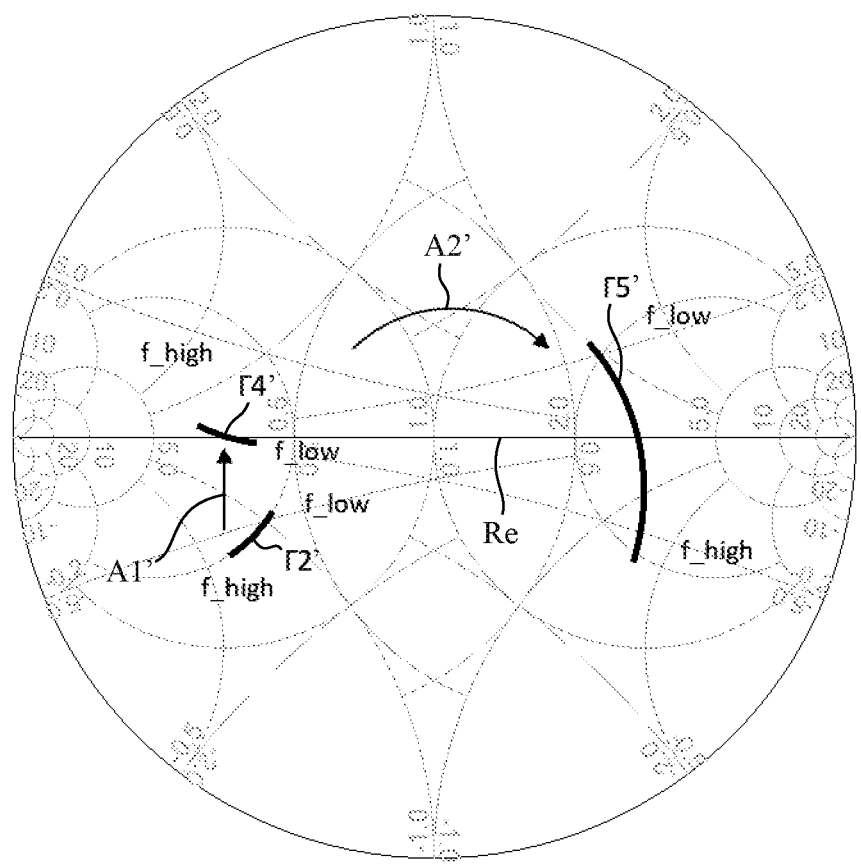
FIG. 6 is an explanatory drawing showing impedance conversion when the auxiliary amplifier in the Doherty amplifier for comparison is set to the off state.

FIG. 6 is a Smith chart in which Γ2', Γ4', and Γ5' are plotted. In the figure, an arrow A1' shows the impedance conversion from Γ2' to Γ4'. Further, an arrow A2' shows the impedance conversion from Γ4' to Γ5'. As shown in FIG. 6, each of the following impedances: Γ2', Γ4', and Γ5' varies depending on frequency.

Hereinafter, a frequency range f_high higher than the center frequency f_center in the operating frequency band, i.e., a frequency range f_high higher than the reference frequency f_ref is referred to as a "high frequency region." Further, a frequency range f_low lower than the center frequency f_center in the operating frequency band. i.e., a frequency range f_low lower than the reference frequency f_ref is referred to as a "low frequency region."

When the output power which is required of the Doherty amplifier 100 is equal to or greater than a predetermined value, while the main amplifier 8 is set to the on state, the auxiliary amplifier 9 is set to the on state. In contrast, when the output power which is required of the Doherty amplifier 100 is less than the predetermined value, while the main amplifier 8 is set to the on state, the auxiliary amplifier 9 is set to the off state. The same goes for the Doherty amplifier 100'.

When the auxiliary amplifier 9 is set to the off state, the impedance on the auxiliary amplifier 9 side as viewed from the output part of the auxiliary amplifier 9 becomes infinite ("Open" in the figure). Therefore, the second output circuit 13 performs the function of an open stub when the auxiliary amplifier 9 is set to the off state. Here, because the electric length of the second output circuit 13 is less than 90 degrees, the second output circuit 13 performs the function of a capacitive load when the auxiliary amplifier 9 is set to the off state.

Γ1 in the Doherty amplifier 100 becomes an impedance equal to 0.5×Ropt. Further, Γ1' in the Doherty amplifier 100' also becomes an impedance equal to 0.5×Ropt. This is because the output matching circuit 19 is disposed.

In contrast with this, Γ2 in the Doherty amplifier 100 becomes a capacitive impedance (refer to FIG. 5). Further. Γ2' in the Doherty amplifier 100' also becomes a capacitive impedance (refer to FIG. 6). This is because the second output circuit 13 performs the function of a capacitive load.

In the Doherty amplifier 100, because the second transmission line 12 is disposed, Γ2 is converted into Γ3. Further, because the frequency characteristic compensation circuit 15 is disposed, Γ3 is converted into Γ4. More specifically, because the second transmission line 12 and the frequency characteristic compensation circuit 15 are disposed, Γ2 is converted into Γ4 (refer to FIG. 5).

Γ3 becomes an impedance lower than 0.5×Ropt at the center frequency f_center, becomes an inductive impedance in the high frequency region f_high, and becomes a capacitive impedance in the low frequency region f_low. In contrast with this, Γ4 becomes a capacitive impedance in the high frequency region f_high, and becomes an inductive impedance in the low frequency region f_low (refer to FIG. 5). This is caused by the frequency characteristic in the frequency characteristic compensation circuit 15. The frequency characteristic in the frequency characteristic compensation circuit 15 will be mentioned later.

In contrast, in the Doherty amplifier 100', because the second transmission line 12 is disposed. Γ2' is converted into Γ4' (refer to FIG. 6). Γ4' becomes an inductive impedance in the high frequency region f_high, and becomes a capacitive impedance in the low frequency region flow (refer to FIG. 6).

More specifically, the second transmission line 12 in the Doherty amplifier 100 performs a function of bringing Γ4 closer to a real axis Re rather than Γ2 by bringing Γ3 closer to the real axis Re rather than Γ2. In other words, the second transmission line 12 in the Doherty amplifier 100 performs a function of returning the impedance (Γ1→Γ2) which is caused by the second output circuit 13 to move away from the real axis Re to close to the real axis Re (Γ2→Γ3).

Further, the second transmission line 12 in the Doherty amplifier 100' performs a function of bringing 14' closer to the real axis Re rather than Γ2'. In other words, the second transmission line 12 in the Doherty amplifier 100' performs a function of returning the impedance (Γ1'-Γ2') which is caused by the second output circuit 13 to move away from the real axis Re to close to the real axis Re (Γ2'→Γ4').

In the Doherty amplifier 100, because the first transmission line 11 is disposed, Γ4 is converted into Γ5 (refer to FIG. 5). Further, in the Doherty amplifier 100', because the first transmission line 11 is disposed. Γ4' is converted into Γ5' (refer to FIG. 6).

Γ5 becomes an impedance higher than 2×Ropt (refer to FIG. 5). Therefore, by using the Doherty amplifier 100, a back-off amount larger than 6 dB can be implemented. Further, Γ5' becomes an impedance higher than 2×Ropt (refer to FIG. 6). Therefore, by using the Doherty amplifier 100', a back-off amount larger than 6 dB can be implemented.

Here, as shown in FIGS. 5 and 6, variations in Γ5' with respect to frequency are larger than variations in Γ5 with respect to frequency. Therefore, the operating frequency band of the Doherty amplifier 100' is narrower than the operating frequency band of the Doherty amplifier 100.

In other words, variations in Γ5 with respect to frequency are smaller than variations in Γ5' with respect to frequency. Therefore, the operating frequency band of the Doherty amplifier 100 is wider than the operating frequency band of the Doherty amplifier 100'. This is because the frequency characteristics in the output circuits 10 and 13 are compensated for because the frequency characteristic compensation circuit is disposed.

More specifically, the frequency characteristic in the first transmission line 11 is that the impedance is inductive in the high frequency region f_high and is capacitive in the low frequency region f_low. Further, the frequency characteristic in a circuit constituted by the second transmission line 12 and the third transmission line 14 (referred to as a "combination circuit" hereinafter) is also that the impedance is inductive in the high frequency region f_high and is capacitive in the low frequency region f_low.

Therefore, in the high frequency region f_high, the inductive impedance provided by the first transmission line 11 and the inductive impedance provided by the combination circuit have a relationship to enhance each other when the output terminal 20 side is viewed from the output part of the main amplifier 8. In contrast, in the low frequency region f_low, the capacitive impedance provided by the first transmission line 11 and the capacitive impedance provided by the combination circuit have a relationship to enhance each other when the output terminal 20 side is viewed from the output part of the main amplifier 8. Therefore, Γ5' in the Doherty amplifier 100' varies greatly depending on frequency.

In contrast with this, the frequency characteristic in the frequency characteristic compensation circuit 15 is that the impedance is capacitive in the high frequency region f_high, is infinite at the center frequency f_center, and is inductive in the low frequency region f_low.

Therefore, in the high frequency region f_high, the capacitive impedance provided by the frequency characteristic compensation circuit 15 performs a function of cancelling out the inductive impedances provided by the output circuits 10 and 13 when the output terminal 20 side is viewed from the output part of the main amplifier 8. In contrast, in the low frequency region f_low, the inductive impedance provided by the frequency characteristic compensation circuit 15 performs a function of cancelling out the capacitive impedances provided by the output circuits 10 and 13 when the output terminal 20 side is viewed from the output part of the main amplifier 8. Therefore, the variations in Γ5 with respect to frequency become smaller than the variations in Γ5' with respect to frequency.

In this way, because the output circuits 10 and 13 are disposed, the Doherty amplifier 100 can increase the back-off amount, like the Doherty amplifier 100'. In addition, because the frequency characteristic compensation circuit 15 is disposed, the Doherty amplifier 100 can increase the operating frequency band in comparison with that of the Doherty amplifier 100'.

Figure 7:
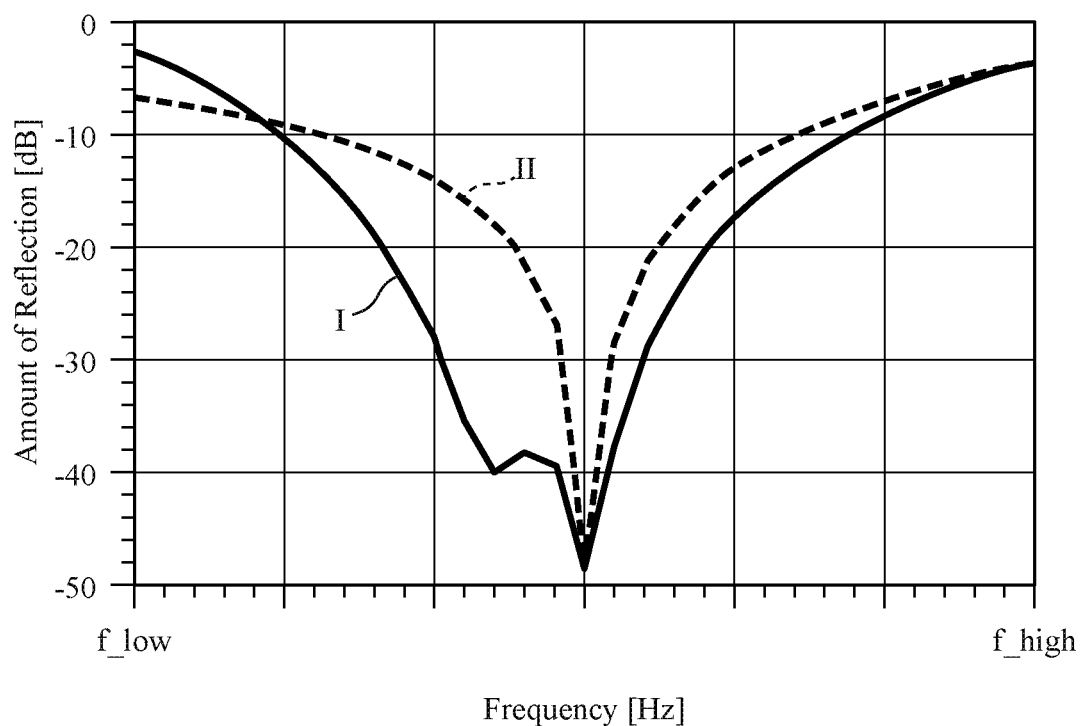
FIG. 7 is a characteristic diagram showing an amount of reflection with respect to frequency.

FIG. 7 is a characteristic diagram showing an amount of reflection of the output power by the main amplifier 8 with respect to frequency. In the figure, a characteristic line I shows the reflection amount when the auxiliary amplifier 9 in the Doherty amplifier 100 is set to the off state. On the other hand, a characteristic line II shows the reflection amount when the auxiliary amplifier 9 in the Doherty amplifier 100' is set to the off state.

As shown in FIG. 7, by using the Doherty amplifier 100, the reflection amount is reduced throughout a wider frequency range as compared with the case of using the Doherty amplifier 100'. Therefore, by using the Doherty amplifier 100, the operating frequency band can be expanded as compared with the case of using the Doherty amplifier 100'.

Figure 8:
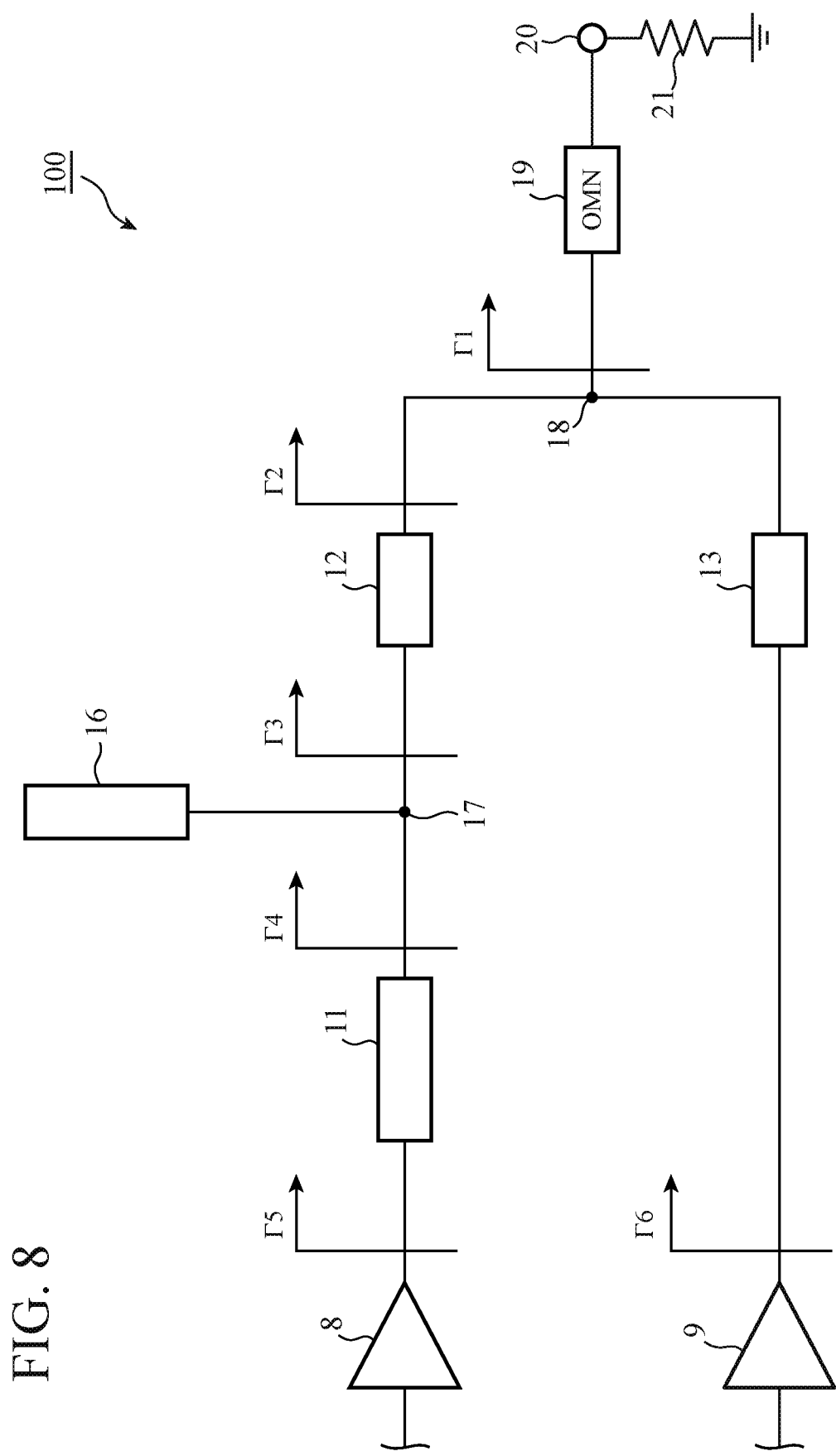
FIG. 8 is an explanatory drawing showing an impedance when the auxiliary amplifier in the Doherty amplifier according to Embodiment 1 is set to an on state.

Next, the impedance in the Doherty amplifier 100 when the auxiliary amplifier 9 is set to the on state will be explained by reference to FIG. 8. More concretely, the impedance in the saturated operating state will be explained.

In the figure, Γ5 shows the impedance on the output terminal 20 side as viewed from the output part of the main amplifier 8. Further, Γ6 shows the impedance on the output terminal 20 side as viewed from the output part of the auxiliary amplifier 9.

When the auxiliary amplifier 9 is set to the on state, Γ5 becomes an impedance equal to Ropt. Here, Ropt1=Ropt as mentioned above. Therefore, there occurs a state where Γ5 is matched to the optimum load impedance Ropt1 of the main amplifier 8.

Further, at this time, Γ6 becomes an impedance equal to Ropt. Here, Ropt2=Ropt as mentioned above. Therefore, there occurs a state where Γ6 is matched to the optimum load impedance Ropt2 of the auxiliary amplifier 9.

Next, a variant of the Doherty amplifier 100 will be explained.

The phase compensation circuit 5 is not limited to the transmission line 6. For example, the phase compensation circuit 5 may be constituted by a lumped constant circuit, a distributed constant circuit, a composite circuit constituted by a lumped constant and a distributed constant, an LC matching circuit, or a circuit using one or more λ/4 lines.

The first output circuit 10 is not limited to the first transmission line 11 and the second transmission line 12. For example, the first output circuit 10 may be constituted by a single transmission line (not illustrated) having an electric length of 90 degrees or more.

The second output circuit 13 is not limited to the third transmission line 14. For example, the second output circuit 13 may be constituted by a lumped constant circuit, a distributed constant circuit, a composite circuit constituted by a lumped constant and a distributed constant, an LC matching circuit, or a circuit using one or more λ/4 lines.

The frequency characteristic compensation circuit 15 is not limited to the open stub 16. For example, the frequency characteristic compensation circuit 15 may be constituted by a lumped constant circuit, a distributed constant circuit, a composite circuit constituted by a lumped constant and a distributed constant, an LC matching circuit, or a transmission line having an electric length of 90 degrees or approximately 90 degrees. More specifically, the frequency characteristic compensation circuit 15 may be constituted by a short stub.

As mentioned above, the Doherty amplifier 100 includes: the amplifiers 8 and 9 including the main amplifier 8 and the auxiliary amplifier 9; the output circuits for the increase in the back-off amount 10 and 13 including the first output circuit 10 disposed between the main amplifier 8 and the output combination unit 18 provided by the amplifiers 8 and 9, and having the first electric length θ1, and the second output circuit 13 disposed between the auxiliary amplifier 9 and the output combination unit 18, and having the second electric length θ2; and the frequency characteristic compensation circuit 15 for band broadening disposed electrically in parallel to the first output circuit 10, for compensating for the frequency characteristics of the impedances in the output circuits 10 and 13. As a result, both the increase in the back-off amount and the band broadening can be achieved.

Further, the second output circuit 13 performs the function of a capacitive load by performing the function of an open stub when the auxiliary amplifier 9 is set to the off state. As a result, the increase in the back-off amount can be implemented.

Further, in the high frequency region f_high with respect to the reference frequency f_ref, the capacitive impedance provided by the frequency characteristic compensation circuit 15 cancels out the inductive impedances provided by the output circuits 10 and 13, and in the low frequency region f_low with respect to the reference frequency f_ref, the inductive impedance provided by the frequency characteristic compensation circuit 15 cancels out the capacitive impedances provided by the output circuits 10 and 13. As a result, the band broadening can be implemented.

Further, the first electric length θ1 is set to a value based on a mathematical expression: θ1=arctan(-√((γ(γ-1))/(γ-4))), using the value γ corresponding to the requested back-off amount OBO, and the second electric length θ2 is set to a value based on a mathematical expression: θ2=arctan (√(((γ-4)(γ-1))/γ)), using the value γ corresponding to the requested back-off amount OBO. More specifically, the first electric length θ1 is set to the value based on the above-mentioned expression (1), and the second electric length θ2 is set to the value based on the above-mentioned expression (2). As a result, the increase in the back-off amount can be implemented.

Further, the first output circuit 10 is constituted by the first transmission line 11 and the second transmission line 12, the second output circuit 13 is constituted by the third transmission line 14, and the combination circuit is constituted by the second transmission line 12 and the third transmission line 14, and the electric length of the first transmission line 11 is set to 90 degrees and the electric length of the combination circuit is set to 90 degrees, so that the electric length of the output circuits 10 and 13 is set to 180 degrees. As a result, the increase in the back-off amount can be implemented. Further, the frequency characteristic compensation circuit 15 can be disposed electrically in parallel to the first output circuit 10.

Further, the frequency characteristic compensation circuit 15 is constituted by an open stub having an electric length of 180 degrees. As a result, the frequency characteristic compensation circuit 15 can be implemented.

The meaning of the term "90 degrees" described in the claims of the present application includes not only exactly 90 degrees, but also approximately 90 degrees. Further, the meaning of the term "180 degrees" described in the claims of the present application includes not only exactly 180 degrees, but also approximately 180 degrees.

Embodiment 2

Figure 9:
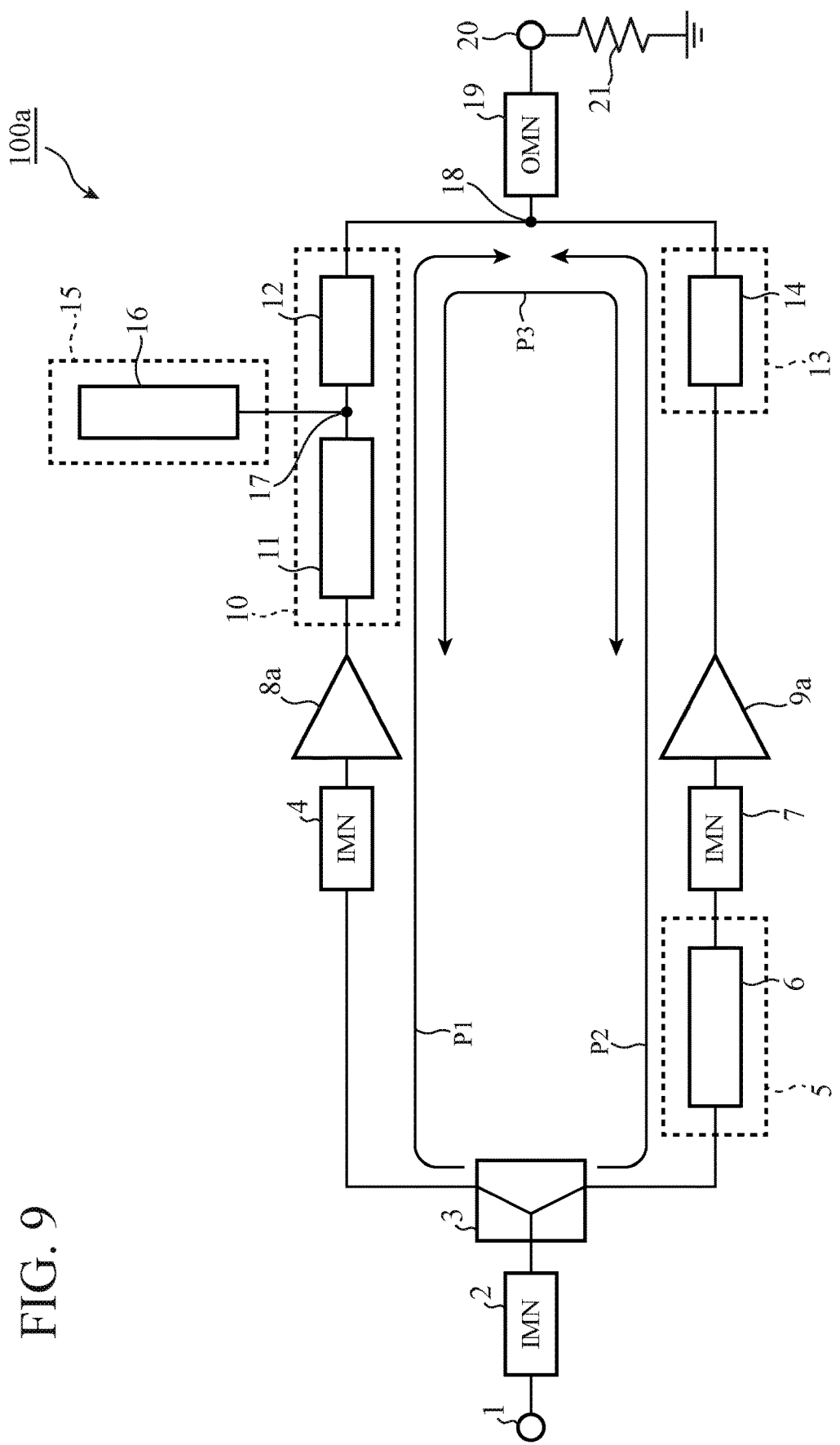
FIG. 9 is a circuit diagram showing a main part of a Doherty amplifier according to Embodiment 2.

FIG. 9 is a circuit diagram showing a main part of a Doherty amplifier according to Embodiment 2. The Doherty amplifier according to Embodiment 2 will be explained by reference to FIG. 9. In FIG. 9, the same structural components as those shown in FIG. 1 and like structural components are denoted by the same reference signs, and an explanation of the structural components will be omitted hereinafter.

As shown in FIG. 9, the Doherty amplifier 100a has a main amplifier 8a and an auxiliary amplifier 9a. The main part of the Doherty amplifier 100a is constituted by an input terminal 1, an input matching circuit 2, a splitter 3, a first input matching circuit 4, a phase compensation circuit 5, a second input matching circuit 7, the main amplifier 8a, the auxiliary amplifier 9a, a first output circuit 10, a second output circuit 13, a frequency characteristic compensation circuit 15, an output matching circuit 19, and an output terminal 20.

The amplifiers 8 and 9 in the Doherty amplifier 100 have electrical properties of output (e.g., output resistance and output amplitude) that are equivalent to each other with respect to bias amounts. Therefore, in case that the bias amounts of the amplifiers 8 and 9 are set to an equal value, the electrical properties of output of the main amplifier 8 are equivalent to the electrical properties of output of the auxiliary amplifier 9. Further, in this case, the saturated output power of the main amplifier 8 is equal to the saturated output power of the auxiliary amplifier 9.

In contrast with this, the amplifiers 8a and 9a in the Doherty amplifier 100a have electrical properties of output that are different from each other with respect to bias amounts. Therefore, in case that the bias amounts of the amplifiers 8a and 9a are set to an equal value, the electrical properties of output of the main amplifier 8a are different from the electrical properties of output of the auxiliary amplifier 9a. Further, in this case, the saturated output power of the main amplifier 8a is different from the saturated output power of the auxiliary amplifier 9a.

Further, in the Doherty amplifier 100, the optimum load impedance Ropt1 in the saturated operating state of the main amplifier 8 is equal to the optimum load impedance Ropt2 in the saturated operating state of the auxiliary amplifier 9. For example, Ropt1=Ropt and Ropt2=Ropt. In contrast with this, in the Doherty amplifier 100a, the optimum load impedance Ropt1 in the saturated operating state of the main amplifier 8a is different from the optimum load impedance Ropt2 in the saturated operating state of the auxiliary amplifier 9a. For example, while Ropt1=Ropt, Ropt2=Ropt'.

In the Doherty amplifier 100a, the characteristic impedance of the first output circuit 10 is set to a value equal to the optimum load impedance Ropt1 in the saturated operating state of the main amplifier 8a. More specifically, this characteristic impedance is set to a value equal to Ropt. Further, in the Doherty amplifier 100a, the characteristic impedance of the second output circuit 13 is set to a value equal to the optimum load impedance Ropt2 in the saturated operating state of the auxiliary amplifier 9a. More specifically, this characteristic impedance is set to a value equal to Ropt'.

In the Doherty amplifier 100a, the output matching circuit 19 provides an impedance match between an output combination unit 18 and the output terminal 20 in such a way that the impedance R on the output terminal 20 side of the output matching circuit has a value shown in the following expression (4).

$$R=(Ropt \times Ropt')/(Ropt+Ropt') \quad (4)$$

As mentioned above, in the Doherty amplifier 100a, the saturated output power of the main amplifier 8a is different from the saturated output power of the auxiliary amplifier 9a. Even in this case, through the same operation as that of the Doherty amplifier 100, both the increase in the back-off amount and the band broadening can be achieved.

Embodiment 3

Figure 10:
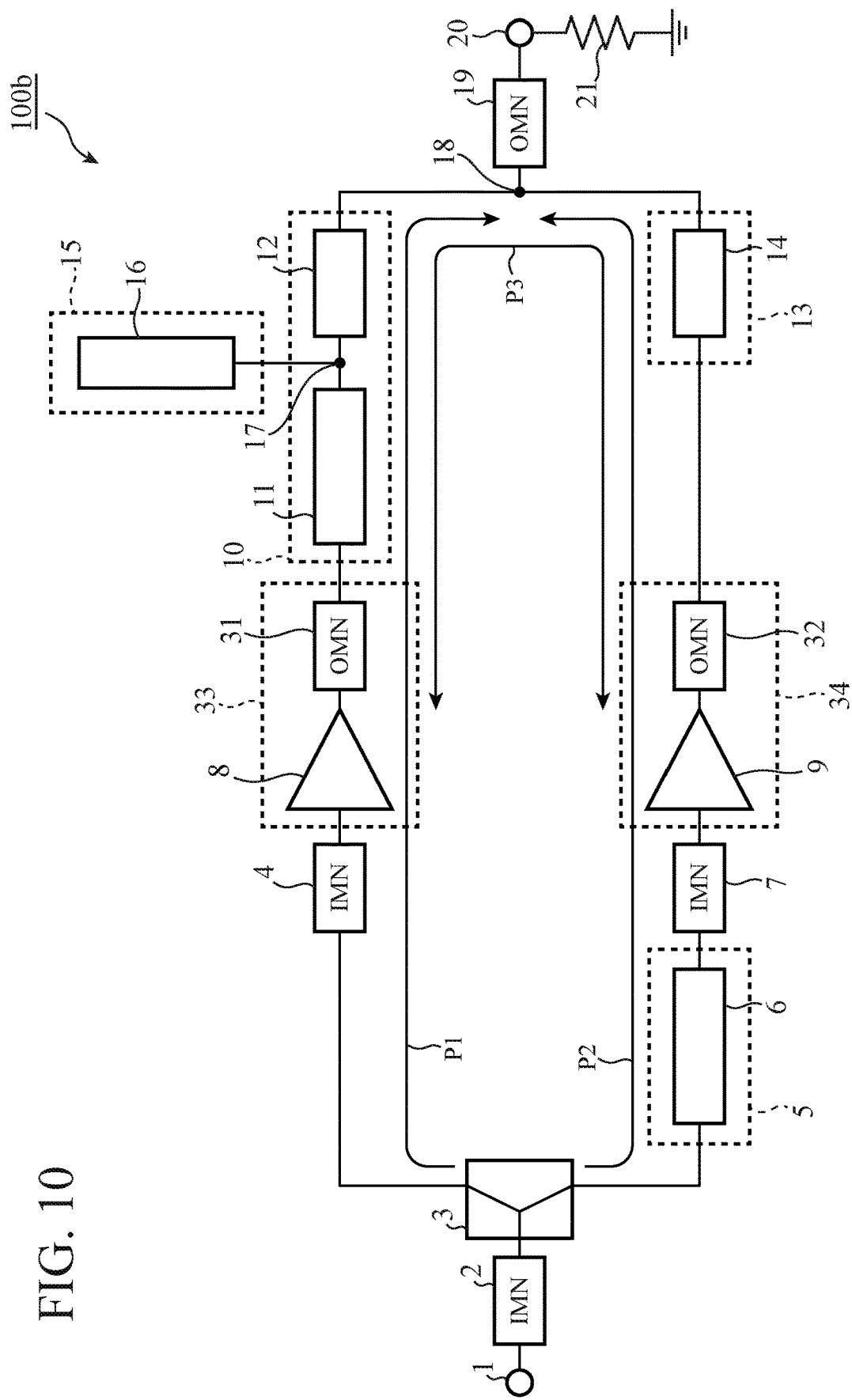
FIG. 10 is a circuit diagram showing a main part of a Doherty amplifier according to Embodiment 3.

FIG. 10 is a circuit diagram showing a main part of a Doherty amplifier according to Embodiment 3. The Doherty amplifier according to Embodiment 3 will be explained by reference to FIG. 10. In FIG. 10, the same structural components as those shown in FIG. 1 and like structural components are denoted by the same reference signs, and an explanation of the structural components will be omitted hereinafter.

As shown in FIG. 10, an output matching circuit (referred to as a "first output matching circuit" hereinafter) 31 is disposed between a main amplifier 8 and a first output circuit 10. The first output matching circuit 31 is constituted by, for example, a lumped constant circuit, a distributed constant circuit, a composite circuit constituted by a lumped constant and a distributed constant, an LC matching circuit, or a circuit using one or more λ/4 lines. The electric length of the first output matching circuit 31 is set to an integral multiple of 180 degrees or approximately 180 degrees when viewed from an output part of the main amplifier 8.

Further, an output matching circuit (referred to as a "second output matching circuit" hereinafter) 32 is disposed between an auxiliary amplifier 9 and a second output circuit 13. The second output matching circuit 32 is constituted by, for example, a lumped constant circuit, a distributed constant circuit, a composite circuit constituted by a lumped constant and a distributed constant, an LC matching circuit, or a circuit using one or more L4 lines. The electric length of the second output matching circuit 32 is set to an integral multiple of 180 degrees or approximately 180 degrees when viewed from an output part of the auxiliary amplifier 9.

The main part of the Doherty amplifier 100b is constituted by an input terminal 1, an input matching circuit 2, a splitter 3, a first input matching circuit 4, a phase compensation circuit 5, a second input matching circuit 7, the main amplifier 8, the auxiliary amplifier 9, the first output circuit 10, the second output circuit 13, a frequency characteristic compensation circuit 15, an output matching circuit 19, an output terminal 20, the first output matching circuit 31, and the second output matching circuit 32.

Because the first output matching circuit 31 is disposed, the optimum load impedance Ropt1 in the saturated operating state of the main amplifier 8 is converted into the optimum load impedance Ropt1' of an amplifier (referred to as a "first amplifier" hereinafter) 33 constituted by the main amplifier 8 and the first output matching circuit 31. More specifically, the optimum load impedance Ropt1' is a value different from that of the optimum load impedance Ropt1. For example, while Ropt1=Ropt, Ropt1'=Ropt".

Because the second output matching circuit 32 is disposed, the optimum load impedance Ropt2 in the saturated operating state of the auxiliary amplifier 9 is converted into the optimum load impedance Ropt2' of an amplifier (referred to as a "second amplifier" hereinafter) 34 constituted by the auxiliary amplifier 9 and the second output matching circuit 32. More specifically, the optimum load impedance Ropt2' is a value different from that of the optimum load impedance Ropt2. For example, while Ropt2=Ropt, Ropt2'=Ropt".

Therefore, the Doherty amplifier 100b can be regarded to be the one in which the first amplifier 33 having the optimum load impedance Ropt1' is disposed instead of the main amplifier 8 having the optimum load impedance Ropt1, in comparison with the Doherty amplifier 100. Further, the Doherty amplifier 100b can be regarded to be the one in which the second amplifier 34 having the optimum load impedance Ropt2' is disposed instead of the auxiliary amplifier 9 having the optimum load impedance Ropt2, in comparison with the Doherty amplifier 100.

As a result, it can be regarded that the operation of the Doherty amplifier 100b is the same as that of the Doherty amplifier 100. By using the Doherty amplifier 100b, both the increase in the back-off amount and the band broadening can be achieved, like in the case of using the Doherty amplifier 100.

The Doherty amplifier 100b may include the amplifiers 8a and 9a instead of the amplifiers 8 and 9.

Further, the Doherty amplifier 100b may have only one of either the first output matching circuit 31 or the second output matching circuit 32.

As mentioned above, the Doherty amplifier 100b includes the first output matching circuit 31 disposed between the main amplifier 8 and the first output circuit 10, and having an electric length which is an integral multiple of 180 degrees, and the second output matching circuit 32 disposed between the auxiliary amplifier 9 and the second output circuit 13, and having an electric length which is an integral multiple of 180 degrees. Even in this case, through the same operation as that of the Doherty amplifier 100, both the increase in the back-off amount and the band broadening can be achieved.

As mentioned above, the meaning of the term "180 degrees" described in the claims of the present application includes not only exactly 180 degrees, but also approximately 180 degrees.

Embodiment 4

Figure 11:
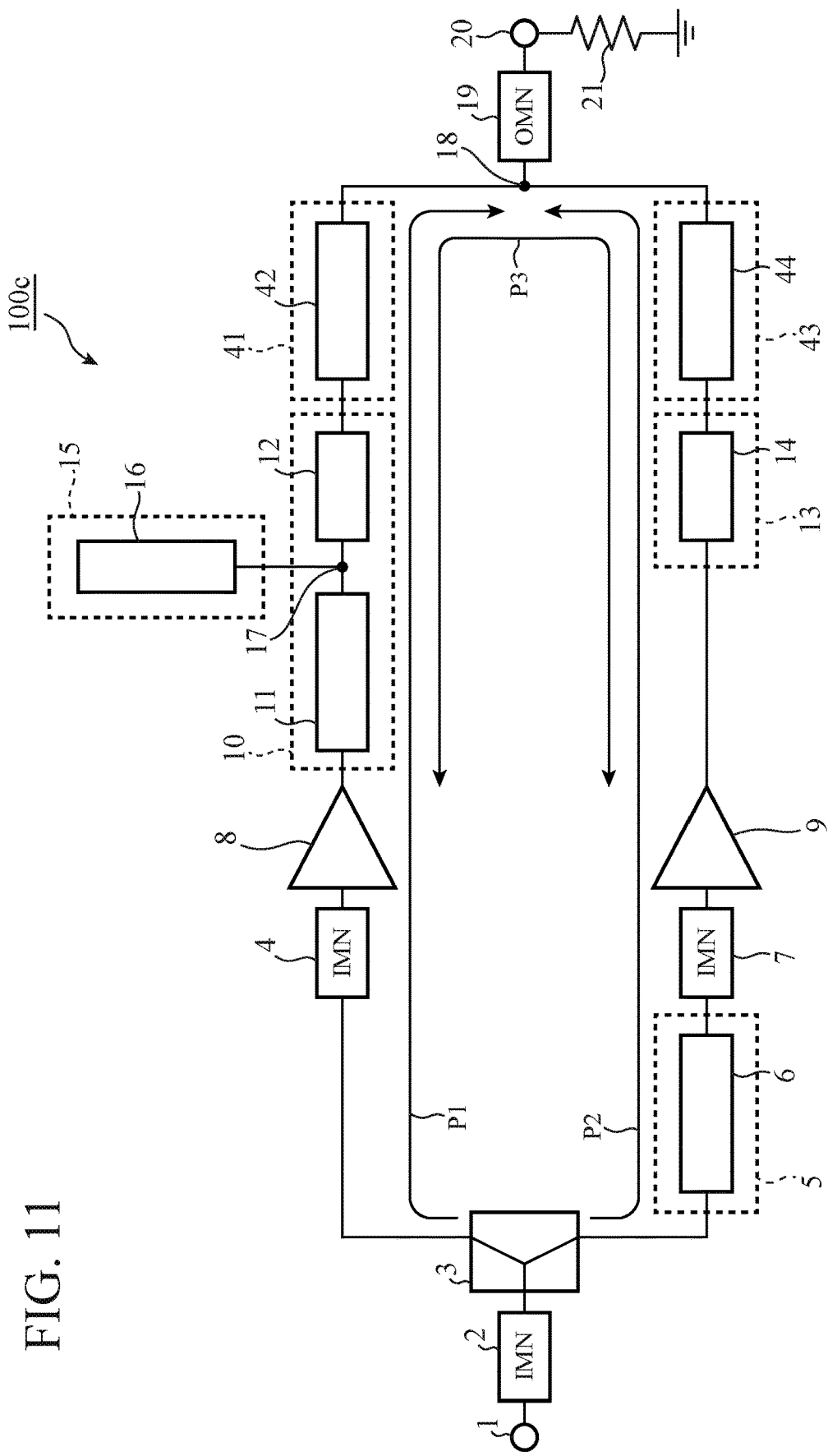
FIG. 11 is a circuit diagram showing a main part of a Doherty amplifier according to Embodiment 4.

FIG. 11 is a circuit diagram showing a main part of a Doherty amplifier according to Embodiment 4. The Doherty amplifier according to Embodiment 4 will be explained by reference to FIG. 11. In FIG. 11, the same structural components as those shown in FIG. 1 and like structural components are denoted by the same reference signs, and an explanation of the structural components will be omitted hereinafter.

As shown in FIG. 11, a circuit (referred to as a "first circuit" hereinafter) 41 is disposed between a first output circuit 10 and an output combination unit 18. The electric length of the first circuit 41 is set to a value which is an integral multiple of 180 degrees or approximately 180 degrees. The first circuit 41 is constituted by, for example, a transmission line 42.

Further, a circuit (referred to as a "second circuit" hereinafter) 43 is disposed between a second output circuit 13 and the output combination unit 18. The electric length of the second circuit 43 is set to a value which is an integral multiple of 180 degrees or approximately 180 degrees. The second circuit 43 is constituted by, for example, a transmission line 44.

The main part of the Doherty amplifier 100c is constituted by an input terminal 1, an input matching circuit 2, a splitter 3, a first input matching circuit 4, a phase compensation circuit 5, a second input matching circuit 7, a main amplifier 8, an auxiliary amplifier 9, the first output circuit 10, the second output circuit 13, a frequency characteristic compensation circuit 15, an output matching circuit 19, an output terminal 20, the first circuit 41, and the second circuit 43.

The operation of the Doherty amplifier 100c is the same as that of the Doherty amplifier 100. By using the Doherty amplifier 100c, both the increase in the back-off amount and the band broadening can be achieved, like in the case of using the Doherty amplifier 100.

The Doherty amplifier 100c may include the amplifiers 8a and 9a instead of the amplifiers 8 and 9.

Further, the Doherty amplifier 100c may have only one of either the first output matching circuit 31 or the second output matching circuit 32.

Further, the Doherty amplifier 100c may have only one of either the first circuit 41 or the second circuits 43.

As mentioned above, the Doherty amplifier 100c includes the first circuit 41 disposed between the first output circuit 10 and the output combination unit 18, and having an electric length which is an integral multiple of 180 degrees, and the second circuit 43 disposed between the second output circuit 13 and the output combination unit 18, and having an electric length which is an integral multiple of 180 degrees. Even in this case, through the same operation as that of the Doherty amplifier 100, both the increase in the back-off amount and the band broadening can be achieved.

As mentioned above, the meaning of the term "180 degrees" described in the claims of the present application includes not only exactly 180 degrees, but also approximately 180 degrees.

Embodiment 5

Figure 12:
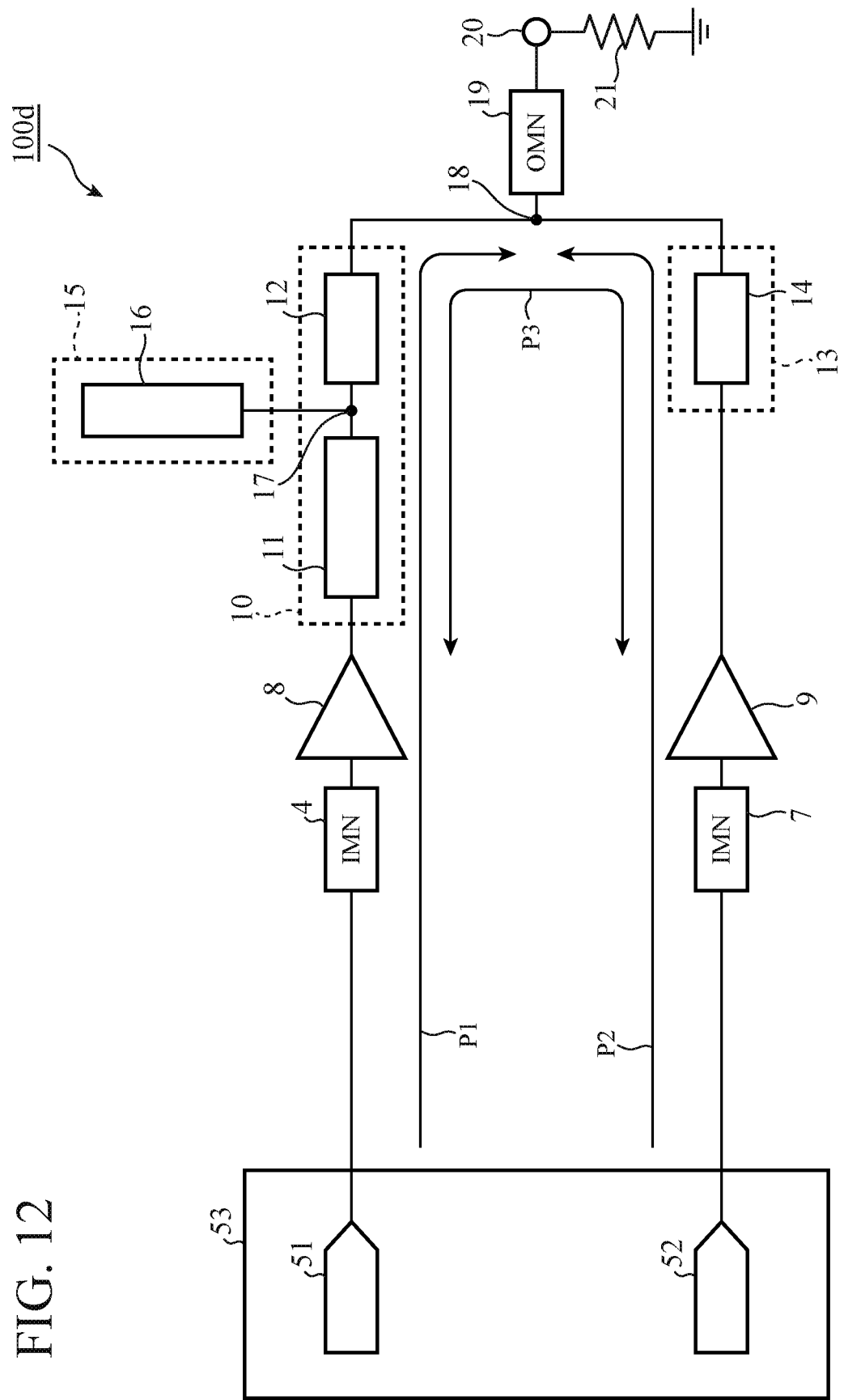
FIG. 12 is a circuit diagram showing a main part of a Doherty amplifier according to Embodiment 5.

FIG. 12 is a circuit diagram showing a main part of a Doherty amplifier according to Embodiment 5. The Doherty amplifier according to Embodiment 5 will be explained by reference to FIG. 12. In FIG. 12, the same structural components as those shown in FIG. 1 and like structural components are denoted by the same reference signs, and an explanation of the structural components will be omitted hereinafter.

As shown in FIG. 12, the Doherty amplifier 100d has an input terminal 51 for a main amplifier 8 (may be referred to as a "first input terminal" hereinafter). More specifically, a first input matching circuit 4 is disposed between the first input terminal 51 and the main amplifier 8. The first input terminal 51 receives input of a signal to a first route P1.

Further, the Doherty amplifier 100d has an input terminal 52 for an auxiliary amplifier 9 (may be referred to as a "second input terminal" hereinafter). More specifically, a second input matching circuit 7 is disposed between the second input terminal 52 and the auxiliary amplifier 9. The second input terminal 52 receives input of a signal to a second route P2.

Each of the first and second input terminals 51 and 52 is electrically connected to a signal source 53. The signal source 53 is constituted by, for example, an inverter, a digital-to-analog converter (DAC), or a direct digital synthesizer (DDS).

The main part of the Doherty amplifier 100d is constituted by the first input matching circuit 4, the second input matching circuit 7, the main amplifier 8, the auxiliary amplifier 9, a first output circuit 10, a second output circuit 13, a frequency characteristic compensation circuit 15, an output matching circuit 19, an output terminal 20, the first input terminal 51, and the second input terminal 52.

In the Doherty amplifier 100d, the gate bias of each of the main and auxiliary amplifiers 8 and 9 is set to a value close to a threshold for gate biases. As a result, there occurs a state in which switching between on and off of the main amplifier 8 is performed depending on the presence or absence of input of a signal to the first input terminal 51. Further, there occurs a state in which switching between on and off of the auxiliary amplifier 9 is performed depending on the presence or absence of input of a signal to the second input terminal 52.

Then, when required output power is equal to or greater than a predetermined value, a signal is inputted by the signal source 53 to each of the first and second input terminals 51 and 52. As a result, while the main amplifier 8 is set to an on state, the auxiliary amplifier 9 is set to an on state. In contrast, when the required output power is less than the predetermined value, a signal is inputted by the signal source 53 only to the first input terminal 51. As a result, while the main amplifier 8 is set to the on state, the auxiliary amplifier 9 is set to an off state.

More specifically, the Doherty amplifier 100d can achieve both the increase in the back-off amount and the band broadening through the same operation as that of the Doherty amplifier 100. In addition, because the amplifiers 8 and 9 use respectively the input terminals 51 and 52 for exclusive use, the switching between on and off of each of the amplifiers 8 and 9 can be properly controlled. As a result, a further improvement in the efficiency of the Doherty amplifier 100d can be provided. Further, a further improvement in the gain of the Doherty amplifier 100d can be provided.

The Doherty amplifier 100d may have a phase compensation circuit 5. In this case, the phase compensation circuit 5 may be disposed between the second input terminal 52 and the second input matching circuit 7.

Further, the Doherty amplifier 100d may have the amplifiers 8a and 9a instead of the amplifiers 8 and 9.

Further, the Doherty amplifier 100d may have at least one of either the first output matching circuit 31 or the second output matching circuit 32.

Further, the Doherty amplifier 100d may have at least one of either the first circuit 41 or the second circuit 43.

As mentioned above, the Doherty amplifier 100d includes the first input terminal 51 for the main amplifier 8, and the second input terminal 52 for the auxiliary amplifier 9, and each of the first and second input terminals 51 and 52 is electrically connected to the signal source 53. As a result, the switching between on and off of each of the amplifiers 8 and 9 can be properly controlled. As a result, a further improvement in the efficiency of the Doherty amplifier 100d can be provided. Further, a further improvement in the gain of the Doherty amplifier 100d can be provided.

It is to be understood that any combination of two or more of the above-mentioned embodiments can be made, various changes can be made in any component according to any one of the above-mentioned embodiments, or any component according to any one of the above-mentioned embodiments can be omitted within the scope of the present invention.

INDUSTRIAL APPLICABILITY

The Doherty amplifier of the present invention can be used for, for example, communication devices.

REFERENCE SIGNS LIST

1: input terminal,
2: input matching circuit,
3: splitter,
4: first input matching circuit,
5: phase compensation circuit,
6: transmission line,
7: second input matching circuit,
8, 8a: main amplifier,
9, 9a: auxiliary amplifier,
10: first output circuit,
11: first transmission line,
12: second transmission line,
13: second output circuit,
14: third transmission line,
15: frequency characteristic compensation circuit,
16: open stub,
17: connecting portion,
18: output combination unit (output combiner),
19: output matching circuit,
20: output terminal,
21: load,
31: first output matching circuit,
32: second output matching circuit,
33: first amplifier,
34: second amplifier,
41: first circuit,
42: transmission line,
43: second circuit,
44: transmission line,
51: first input terminal,
52: second input terminal,
53: signal source, and

The invention claimed is:

1. A Doherty amplifier comprising:
amplifiers including a main amplifier and an auxiliary amplifier;
output circuits for increase in a back-off amount, including: a first output circuit disposed between the main amplifier and an output combiner in which outputs from the amplifiers are combined, the first output circuit having a first electric length, and a second output circuit disposed between the auxiliary amplifier and the output combiner, and having a second electric length; and
a frequency characteristic compensation circuit for band broadening disposed electrically in parallel to the first output circuit, to compensate for frequency characteristics of impedances in the output circuits, wherein
when the auxiliary amplifier is set to an off state, the second output circuit performs a function of an open stub, thereby performing a function of a capacitive load, and
the first output circuit is directly adjacent to the main amplifier, and the second output circuit is directly adjacent to the auxiliary amplifier.

2. The Doherty amplifier according to claim 1, wherein in a high frequency region with respect to a reference frequency, a capacitive impedance provided by the frequency characteristic compensation circuit cancels out inductive impedances provided by the output circuits, while in a low frequency region with respect to the reference frequency, an inductive impedance provided by the frequency characteristic compensation circuit cancels out capacitive impedances provided by the output circuits.

3. The Doherty amplifier according to claim 1, wherein the first electric length $\theta 1$ is set to a value based on a mathematical expression: $\theta 1 = \arctan(-\sqrt{((\gamma(\gamma-1)/(\gamma-4))})$, using a value $\gamma$ corresponding to a requested back-off amount, and the second electric length $\theta 2$ is set to a value based on a mathematical expression: $\theta 2 = \arctan(\sqrt{(((\gamma-4)(\gamma-1))/\gamma)})$, using the value $\gamma$ corresponding to the requested back-off amount.

4. The Doherty amplifier according to claim 1, wherein the first output circuit is constituted by a first transmission line and a second transmission line, the second output circuit is constituted by a third transmission line, and a combination circuit is constituted by the second transmission line and the third transmission line, and wherein an electric length of the first transmission line is set to 90 degrees and an electric length of the combination circuit is set to 90 degrees, so that an electric length of the output circuit is set to 180 degrees.

5. The Doherty amplifier according to claim 1, wherein the frequency characteristic compensation circuit is constituted by an open stub having an electric length of 180 degrees.

6. The Doherty amplifier according to claim 1, wherein saturated output power of the main amplifier is different from saturated output power of the auxiliary amplifier.

7. The Doherty amplifier according to claim 1, wherein the Doherty amplifier comprises a first output matching circuit disposed between the main amplifier and the first output circuit, and having an electric length which is an integral multiple of 180 degrees, and a second output matching circuit disposed between the auxiliary amplifier and the second output circuit, and having an electric length which is an integral multiple of 180 degrees.

8. The Doherty amplifier according to claim 1, wherein the Doherty amplifier comprises a first circuit disposed between the first output circuit and the output combiner, and having an electric length which is an integral multiple of 180 degrees, and a second circuit disposed between the second output circuit and the output combiner, and having an electric length which is an integral multiple of 180 degrees.

9. The Doherty amplifier according to claim 1, wherein the Doherty amplifier comprises: a first input terminal for the main amplifier and a second input terminal for the auxiliary amplifier, and wherein each of the first and second input terminals is electrically connected to a signal source.

10. A Doherty amplifier comprising:
amplifiers including a main amplifier and an auxiliary amplifier;
output circuits for increase in a back-off amount, including: a first output circuit that is constituted by a first transmission line and a second transmission line, and disposed between the main amplifier and an output combiner in which outputs from the amplifiers are combined, the first output circuit having a first electric length, and a second output circuit that is constituted by a third transmission line, and disposed between the auxiliary amplifier and the output combiner, and having a second electric length; and
a frequency characteristic compensation circuit for band broadening disposed electrically in parallel to the first output circuit, to compensate for frequency characteristics of impedances in the output circuits,
wherein the first output circuit is directly adjacent to the main amplifier, and the second output circuit is directly adjacent to the auxiliary amplifier,
wherein the frequency characteristic compensation circuit is located between the first transmission line and the second transmission line.

11. The Doherty amplifier according to claim 10, wherein when the auxiliary amplifier is set to an off state, the second output circuit performs a function of an open stub, thereby performing a function of a capacitive load.

12. The Doherty amplifier according to claim 10, wherein in a high frequency region with respect to a reference frequency, a capacitive impedance provided by the frequency characteristic compensation circuit cancels out inductive impedances provided by the output circuits, while in a low frequency region with respect to the reference frequency, an inductive impedance provided by the frequency characteristic compensation circuit cancels out capacitive impedances provided by the output circuits.

13. The Doherty amplifier according to claim 10, wherein the first electric length $\theta 1$ is set to a value based on a mathematical expression: $\theta 1 = \arctan(-\sqrt{((\gamma(\gamma-1))/(\gamma-4))})$, using a value $\gamma$ corresponding to a requested back-off amount, and the second electric length $\theta 2$ is set to a value based on a mathematical expression: $\theta 2 = \arctan((((\gamma-4)(\gamma-1))/\gamma))$, using the value $\gamma$ corresponding to the requested back-off amount.

14. The Doherty amplifier according to claim 10, wherein the first output circuit is constituted by a first transmission line and a second transmission line, the second output circuit is constituted by a third transmission line, and a combination circuit is constituted by the second transmission line and the third transmission line, and wherein an electric length of the first transmission line is set to 90 degrees and an electric length of the combination circuit is set to 90 degrees, so that an electric length of the output circuit is set to 180 degrees.

15. The Doherty amplifier according to claim 10, wherein the frequency characteristic compensation circuit is constituted by an open stub having an electric length of 180 degrees.

16. The Doherty amplifier according to claim 10, wherein saturated output power of the main amplifier is different from saturated output power of the auxiliary amplifier.

17. The Doherty amplifier according to claim 10, wherein the Doherty amplifier comprises a first output matching circuit disposed between the main amplifier and the first output circuit, and having an electric length which is an integral multiple of 180 degrees, and a second output matching circuit disposed between the auxiliary amplifier and the second output circuit, and having an electric length which is an integral multiple of 180 degrees.

18. The Doherty amplifier according to claim 10, wherein the Doherty amplifier comprises a first circuit disposed between the first output circuit and the output combiner, and having an electric length which is an integral multiple of 180 degrees, and a second circuit disposed between the second output circuit and the output combiner, and having an electric length which is an integral multiple of 180 degrees.

19. The Doherty amplifier according to claim 10, wherein the Doherty amplifier comprises: a first input terminal for the main amplifier and a second input terminal for the auxiliary amplifier, and wherein each of the first and second input terminals is electrically connected to a signal source.

* * * * *